United States Patent [19]

Katakura

[11] Patent Number: 4,516,081
[45] Date of Patent: May 7, 1985

[54] VOLTAGE CONTROLLED VARIABLE GAIN CIRCUIT

[75] Inventor: Masayuki Katakura, Yokohama, Japan

[73] Assignee: Sony Corporation, Tokyo, Japan

[21] Appl. No.: 424,406

[22] Filed: Sep. 27, 1982

[30] Foreign Application Priority Data

Oct. 2, 1981 [JP] Japan ................. 56-156096

[51] Int. Cl.³ .................... H03G 3/30; H03F 3/45
[52] U.S. Cl. ..................... 330/254; 330/257
[58] Field of Search ........... 330/254, 257, 278, 284; 358/27

[56] References Cited

U.S. PATENT DOCUMENTS 4,422,051 12/1983 Katakura et al. ............ 330/254 X

FOREIGN PATENT DOCUMENTS 56-46313 4/1981 Japan ................. 330/254
56-27002 6/1981 Japan .

Primary Examiner—James B. Mullins
Attorney, Agent, or Firm—Lewis H. Eslinger; Alvin Sinderbrand

[57] ABSTRACT

A voltage controlled variable gain circuit suitable for construction as an integrated circuit includes a first current divider comprised of two NPN transistors; a second current divider comprised of two NPN transistors, a control voltage for setting the gain of the circuit being supplied to the bases of a transistor of each current divider; an operational amplifier for producing a first signal in response to an input current, and output currents from each current divider; first and second current sources, each producing a constant current; a first differential amplifier comprised of two NPN transistors having emitters supplied with the constant current from the first current source and the collector of one transistor supplying a drive current to the first current divider; and a second differential amplifier comprised of two NPN transistors having emitters supplied with the constant current from the second current source and the collector of one transistor supplying a drive current to the second current divider; the steady state currents through both first and second current dividers being controlled to a value less than one-half the value of the constant current from the first and second current sources, by constructing the emitter areas of the other transistors of each differential amplifier to be N times larger than the emitter areas of the one transistors thereof; or by supplying offset voltages to the bases of the transistors of both differential amplifiers; or by connecting the emitters of the two transistors of each differential amplifier with a resistive element.

12 Claims, 6 Drawing Figures

VOLTAGE CONTROLLED VARIABLE GAIN CIRCUIT

BACKGROUND OF THE INVENTION

1. Field of the Invention

This invention relates generally to variable gain circuits and, more particularly, is directed to a variable gain circuit of the type having a gain which is varied exponentially with respect to a control voltage supplied thereto.

2. Description of the Prior Art

When using variable gain circuits in, for example, audio noise reduction circuits, it is generally required that high performance variable gain circuits be used. Accordingly, variable gain circuits of the type using bipolar junction transistors are frequently employed in such noise reduction circuits. With such arrangement, the exponential voltage-current characteristic of the bipolar junction transistors provides that the gain of the variable gain circuit is varied exponentially with respect to a control voltage supplied thereto.

Such variable gain circuits of the exponential type are particularly advantageous for use with noise reduction circuits when constructed as monolithic bipolar integrated circuits. In particular, such monolithic bipolar integrated circuits provide substantially perfect thermal coupling and compatibility of the characteristics of the components thereof. However, it becomes extremely difficult, if not impossible, to provide conventional transistors having conductivities which are in substantially perfect complement to each other with such monolithic integrated circuits. As a result, lateral transistors are employed as PNP transistors in the monolithic integrated circuit, but such lateral PNP transistors are markedly inferior to conventional PNP transistors as to the current amplification factor and cut-off frequency.

In order to overcome such drawbacks, a voltage controlled variable gain circuit has been devised in which a differential amplifier comprised of bipolar junction transistors having the emitters thereof commonly supplied with a constant current from a constant current source, is driven by the output of an operational amplifier to which an input signal is supplied. First and second current divider circuits are provided, each comprised of two bipolar junction transistors having the emitters thereof commonly connected to the collector of a respective transistor of the differential amplifier and with the output signal from one transistor of each current divider circuit being fed back to the input of the operational amplifier. The output signal of the variable gain circuit is produced in response to the output signals from the other transistors of the first and second current divider circuits. With this arrangement, the current gain of the circuit is represented as an exponential function of the control voltage supplied to the first and second current divider circuits, and the overall characteristics of the circuit are governed essentially by the properties of the transistors used in the first and second current divider circuits. Since NPN transistors with good operating characteristics are used for such transistors, optimum characteristics of the circuit are produced, and the circuit becomes particularly suitable for production as a monolithic integrated circuit.

However, with the latter circuit, the constant current supplied to the emitters of the transistors used in the differential amplifier must be set to a value larger than the maximum possible value of the sum of the input and output currents to and from the circuit. On the other hand, it is to be appreciated that the steady state currents of the current divider circuits which are supplied by the transistors of the differential amplifier are always equal to one-half the value of the constant current. As a result of such large steady state currents, shot noise in the current divider circuits is undesirably increased. Further, the current dividing ratios of the current divider circuits fluctuate in response to heat noise caused by the ohmic resistances of the transistors used in the current divider circuits, the degree of such fluctuations depending on the magnitude of the steady state currents, in the same manner as the shot noise.

In addition, in the case where an offset voltage exists in the current divider circuits, or where a gain deviation exists in current inverter circuits at the outputs of the current divider circuits, an offset component is generated in the output current of the variable gain circuit, even when the input current supplied thereto is equal to zero, the magnitude of the offset component being dependent on the control signal supplied to the variable gain circuit. As a result, a feedthrough component representative of variations in the control signal will appear in the output signal, with the magnitude of the feedthrough component also being dependent on the steady state currents through the current divider circuits.

OBJECTS AND SUMMARY OF THE INVENTION

Accordingly, it is an object of this invention to provide a variable gain circuit that avoids the above-described difficulties encountered with the prior art.

More particularly, it is an object of this invention to provide a variable gain circuit of the exponential type which is particularly adapted for construction as a bipolar integrated circuit.

It is another object of this invention to provide a variable gain circuit having reduced steady state or quiescent currents supplied to the current divider circuits thereof to reduce shot noise and feedthrough components.

In accordance with an aspect of this invention, a variable gain circuit includes first current divider means including first and second transistors producing at least one output signal in response to a control signal; second current divider means including third and fourth transistors producing at least one output signal in response to the control signal; amplifier means for producing a first signal in response to an input signal and the at least one output signal from the first and second current divider means; current source means for producing a constant current; differential amplifier means for controlling current flow to the first and second current divider means, respectively, in response to the first signal and the constant current so that steady state currents flowing through the first and second current divider means are controlled to a value less than one-half of the value of the constant current; and output means for producing an output signal in response to the at least one output signal from the first and second current divider means.

The above, and other, objects, features and advantages of the present invention will become readily apparent in the following detailed description of illustrative embodiments of the invention which is to be read in connection with the accompanying drawings.

DETAILED DESCRIPTION OF THE PREFERRED EMBODIMENTS

Figure 1:
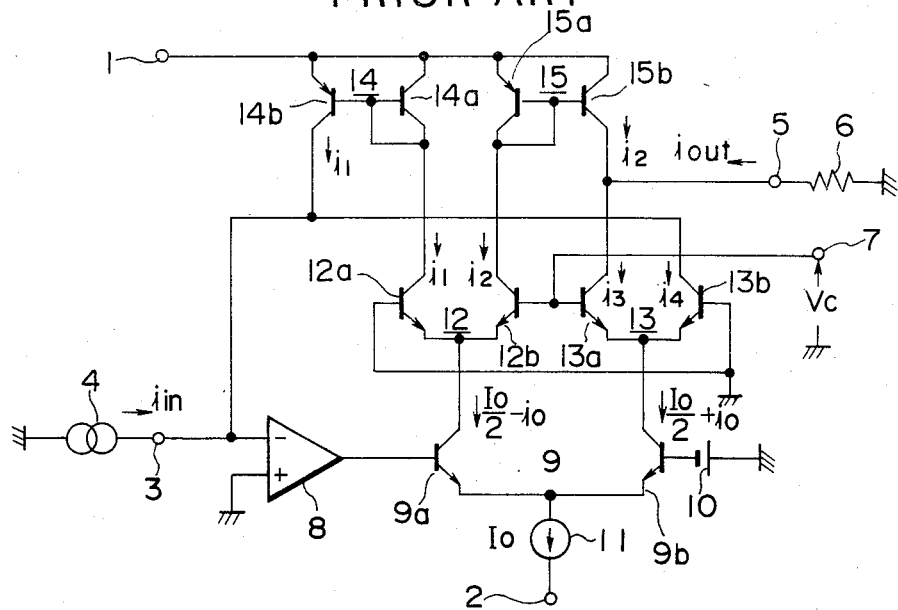
FIG. 1 is a circuit-wiring diagram of a variable gain circuit according to the prior art.

Referring to the drawings in detail, and initially to FIG. 1 thereof, a voltage controlled variable gain circuit according to the prior art includes positive and negative voltage supply terminals 1 and 2 supplied with a positive voltage and a negative voltage, respectively. An input current $i_{in}$ from an input signal source 4 is supplied through an input terminal 3 to an inverting input of an operational amplifier 8, the non-inverting input thereof being connected to ground potential. The output of operational amplifier 8, in turn, drives a differential amplifier 9 of the variable gain circuit, differential amplifier being comprised of two NPN bipolar junction transistors 9a and 9b. In particular, the output from operational amplifier 8 is supplied to the base of transistor 9a, while a bias voltage source 10 supplies a bias voltage to the base of transistor 9b. The emitters of transistors 9a and 9b are commonly connected to a constant current source 11 which supplies a constant current $I_0$ thereto, constant current source 11 also being connected to negative voltage supply terminal 2.

The variable gain circuit of FIG. 1 also includes first and second current divider circuits 12 and 13. In particular, current divider circuit 12 is comprised of two NPN bipolar junction transistors 12a and 12b having their emitters commonly connected to the collector of transistor 9a of differential amplifier 9 and supplied with an operating current therefrom, and second current divider circuit 13 is comprised of two NPN bipolar junction transistors 13a and 13b having their emitters commonly connected to the collector of transistor 9b of differential amplifier 9 and supplied with an operating current therefrom. In this regard, first and second current divider circuits 12 and 13 are driven by the currents from the collectors of transistors 9a and 9b, respectively, of differential amplifier 9. The bases of transistors 12a and 13b are commonly connected to ground, while the bases of transistors 12b and 13a are commonly supplied with a gain control voltage $V_C$ from a gain control terminal 7 for adjusting the gain of the variable gain circuit. In this manner, currents $i_1$, $i_2$, $i_3$, $i_4$ are caused to flow through the collectors of transistors 12a, 12b, 13a and 13b, respectively.

A first current mirror or current inverter circuit 14 is connected between positive voltage supply terminal 1 and the collector of transistor 12a. In particular, current mirror circuit 14 includes a a first PNP transistor 14a with its emitter connected to positive voltage supply terminal 1, its collector connected to the collector of transistor 12a and supplied with current $i_1$ therefrom, and its base connected to its collector. Current mirror circuit 14 also includes a second PNP transistor 14b having its base connected to the base of transistor 14a, its emitter connected to positive voltage supply terminal 1 and its collector connected to the collector of transistor 13b and to the inverting input of operational amplifier 8. In this manner, since a current $i_1$ flows through transistor 14a of current mirror circuit 14, the same current $i_1$ also flows through the collector of transistor 14b. This latter current $i_1$, along with current $i_4$ at the collector of transistor 13b, is fed back to the inverting input of operational amplifier 8. In like manner, a second current mirror or current inverter circuit 15 is provided and is comprised of a first PNP transistor 15a having its emitter connected to positive voltage supply terminal 1, its collector connected to the collector of transistor 12b and supplied with current $i_2$ therefrom, and its base connected to its collector. A second PNP transistor 15b of current mirror circuit 15 has its emitter connected to positive voltage supply terminal 1, its collector connected to the collector of transistor 13a and its base connected to the base of transistor 15a. In this manner, since the current $i_2$ from the collector of transistor 12b flows through transistor 15a, a current $i_2$ is also caused to flow through the collector of transistor 15b. An output terminal 5 of the variable gain circuit is connected to the junction point between the collectors of transistors 13a and 15b to provide an output current $i_{out}$, as a function of currents $i_2$ and $i_3$, to an output load resistor 6.

With the circuit arrangement shown in FIG. 1, currents $i_1$, $i_2$, $i_3$ and $i_4$ at the collectors of transistors 12a, 12b, 13a and 13b, respectively, can be expressed as follows:

$$i_1 = \left(\frac{I_0}{2} - i_o\right) \cdot \frac{1}{1 + \exp(V_C/V_T)}, \tag{1}$$

$$i_2 = \left(\frac{I_0}{2} - i_o\right) \cdot \frac{\exp(V_C/V_T)}{1 + \exp(V_C/V_T)}, \tag{2}$$

$$i_3 = \left(\frac{I_0}{2} + i_o\right) \cdot \frac{\exp(V_C/V_T)}{1 + \exp(V_C/V_T)}, \tag{3}$$

$$i_4 = \left(\frac{I_0}{2} + i_o\right) \cdot \frac{1}{1 + \exp(V_C/V_T)}, \tag{4}$$

where $I_0$ represents the constant current from constant current source 11, $i_o$ represents the current differential flowing through transistors 9a and 9b of differential amplifier 9, $V_C$ represents the gain control voltage supplied to gain control terminal 7 and $V_T$ represents the voltage equivalent of temperature and is equal to kT/q, where k is Boltzmann's constant, T is the temperature and q is the charge. For example, at room temperature where T=300° K., $V_T$=26 mV. It is to be appreciated from FIG. 1 that the input current $i_{in}$ supplied to input terminal 3 and the output current $i_{out}$ at output terminal 5 can be represented as follows:

$$i_{in} = i_4 - i_1 \tag{5},$$

$$i_{out} = i_3 - i_2 \tag{6}.$$

By substituting equations (1)-(4) into equations (5) and (6), equations for the input current $i_{in}$ and the output current $i_{out}$ can be obtained as follows:

$$i_{in} = 2i_o \cdot \frac{1}{1 + \exp(V_C/V_T)} \quad (7)$$

$$i_{out} = 2i_o \cdot \frac{\exp(V_C/V_T)}{1 + \exp(V_C/V_T)} \quad (8)$$

It is to be appreciated from equations (7) and (8), that the current gain A of the gain control circuit of FIG. 1 can therefore be obtained as follows:

$$A = i_{out}/i_{in} = \exp(V_C/V_T) \quad (9).$$

From equation (9), it is to be appreciated that the current gain A of the variable gain circuit of FIG. 1 is represented as an exponential function of the control voltage $V_C$. Further, the overall characteristics of the variable gain circuit of FIG. 1 are governed essentially by the properties of the transistors of current divider circuits 12 and 13. Since NPN bipolar junction transistors with good operating characteristics are used, the gain control circuit of FIG. 1 can be constructed as a monolithic integrated circuit.

However, various problems arise with the variable gain circuit of FIG. 1. In particular, since constant current source 11 connected to the emitters of transistors 9a and 9b of differential amplifier 9 determines the maximum current that can be handled by the variable gain circuit, constant current $I_0$ therefrom must be set to a value larger than the maximum possible value of the sum of the input current $i_{in}$ and the output current $i_{out}$. It is to be appreciated, however, that during steady state conditions, the steady state or quiescent currents through current divider circuits 12 and 13, that is, supplied by transistors 9a and 9b, are always equal to $I_0/2$. Such relatively large steady state currents flowing through current divider circuits 12 and 13 result in undesirable shot noise and feedthrough. Generally, shot noise in the current divider circuits is determined by the current flowing through the circuits so that large currents flowing through current divider circuits 12 and 13 result in large shot noise. Further, the current dividing ratios of current divider circuits 12 and 13 fluctuate in response to heat noise caused by ohmic resistances of the transistors used in the current divider circuits, the degree of such fluctuations depending on the magnitude of the aforementioned steady state currents, in the same manner as the aforementioned shot noise.

In addition, in the case where an offset voltage exists in the current divider circuits or a gain deviation exists in the current inverter circuits, an offset component is generated in the output current $i_{out}$ of the variable gain circuit, even when the input current $i_{in}$ is equal to zero, the magnitude of the offset component being dependent on the control voltage $V_C$ supplied to the variable gain circuit. As a result, a feedthrough component representative of variations in the control voltage $V_C$ will appear in the output current $i_{out}$, with the magnitude of the feedthrough component also being dependent on these steady state currents through the current divider circuits.

The present invention is designed to overcome the aforementioned disadvantages in the prior art and to provide a voltage controlled variable gain circuit that can be constructed as a monolithic integrated circuit and in which shot noise and feedthrough are substantially reduced by reducing the steady state currents through the current divider circuits.

Figure 2:
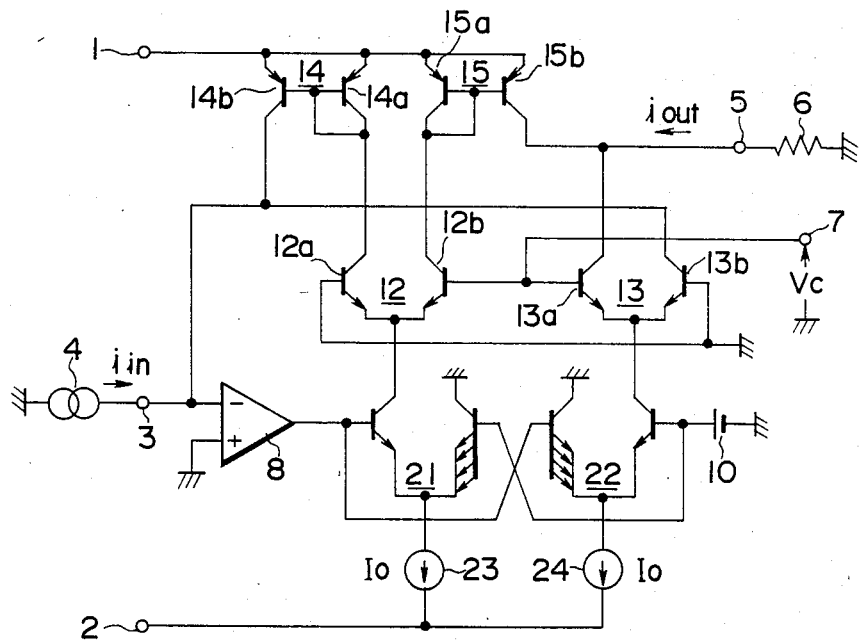
FIG. 2 is a circuit-wiring diagram of a variable gain circuit according to one embodiment of the present invention.

Referring to FIG. 2, a voltage controlled variable gain circuit according to one embodiment of this invention is shown, in which elements corresponding to those previously described in relation to the prior art variable gain circuit of FIG. 1 are identified by the same reference numerals and a detailed explanation thereof will be omitted herein for the sake of brevity. In the variable gain circuit of FIG. 2, differential amplifier 9 is replaced by first and second differential amplifiers 21 and 22, and constant current source 11 is replaced by constant current sources 23 and 24. The remainder of the circuit of FIG. 2, however, is identical to that shown in FIG. 1. The novel aspects of the gain control circuit of FIG. 2 are shown more particularly in FIG. 3 which will now be described in greater detail. As shown therein, first differential amplifier 21 is comprised of first and second NPN bipolar junction transistors 31 and 32 having their emitters commonly connected to constant current source 23 which supplies a constant current $I_0$ thereto. In like manner, second differential amplifier 22 is comprised of first and second NPN bipolar junction transistors 33 and 34 having their emitters commonly connected to constant current source 24 which also supplies a constant current $I_0$ thereto. Constant current sources 23 and 24 are also connected to negative voltage supply terminal 2. The collectors of transistors 32 and 34 are connected to ground potential, while the collectors of transistors 31 and 33 are connected to the commonly-connected emitters of transistors 12a and 12b and the commonly-connected emitters of transistors 13a and 13b, respectively, to supply respective currents $I_1$ and $I_2$ to current divider circuits 12 and 13. The bases of transistors 31 and 34 are connected to a first input terminal 26 supplied with the output from operational amplifier 8, while the bases of transistors 32 and 33 are connected to a second input terminal 27 supplied with the bias voltage from bias voltage source 10.

Figure 4:
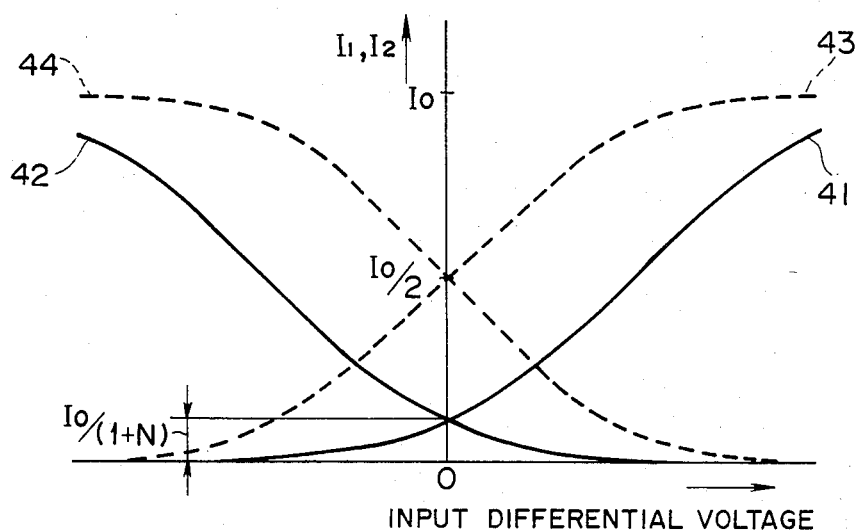
FIG. 4 is a graphical diagram used for illustrating the operation of the variable gain circuit of FIG. 2.

In accordance with one aspect of the present invention, transistors 32 and 34 of first and second differential amplifiers 21 and 22, respectively, are constructed with emitter areas equal to N times the emitter areas of transistors 31 and 33, respectively. In this manner, transistors 32 and 34 each has a saturation current equal to N times the saturation currents of transistors 31 and 33, respectively. Thus, if equal and constant currents $I_0$ flow from constant current sources 23 and 24, the collector currents $I_1$ and $I_2$ of transistors 31 and 33, which are supplied to current divider circuits 12 and 13, respectively, vary with respect to the input differential voltage between input terminals 26 and 27, as shown in FIG. 4 by curves 41 and 42, respectively. It is to be appreciated that, during steady state conditions, when the input differential voltage between input terminals 26 and 27 is equal to zero, that is, $I_1 = I_2$, since the saturation currents of transistors 32 and 34 are N times the saturation currents of transistors 31 and 33, $I_1 = I_2 = I_0/(1+N)$. In this manner, the collector currents of transistors 31 and 33 which are supplied to current divider circuits 12 and 13, respectively, can be reduced by merely increasing the value N. It is to be appreciated that the largest possible values of collector currents $I_1$ and $I_2$ are dependent on the magnitude of constant current $I_0$ from constant current sources 23 and 24, as previously described in regard to the prior art circuit of FIG. 1. Thus, by selecting the value of constant current $I_0$ as a function of the input current $i_{in}$ and the output current $i_{out}$, and selecting the value N independently of the selected constant current $I_0$, the steady state current through current divider circuits 12 and 13 can be greatly reduced from the value of the currents flowing through such current divider circuits in the prior art circuit of FIG. 1. As a result, shot noise and feedthrough are substantially reduced, while still providing that the circuit can be constructed as a monolithic integrated circuit. For comparison purposes, the value N for transistors 9a and 9b of differential amplifier 9 in the variable gain circuit of FIG. 1 is equal to unity, and the collector currents from transistors 9a and 9b supplied to current divider circuits 12 and 13 are shown by dashed lines 43 and 44, respectively, in FIG. 4. It is to be appreciated from the curves of FIG. 4 that the currents $I_1$ and $I_2$ supplied to current divider circuits 12 and 13 with the embodiment of the present invention shown in FIG. 2 are substantially reduced from the currents $I_2$ and $I_2$ supplied to current divider circuits 12 and 13 with the variable gain circuit of FIG. 1 according to the prior art.

Figure 3:
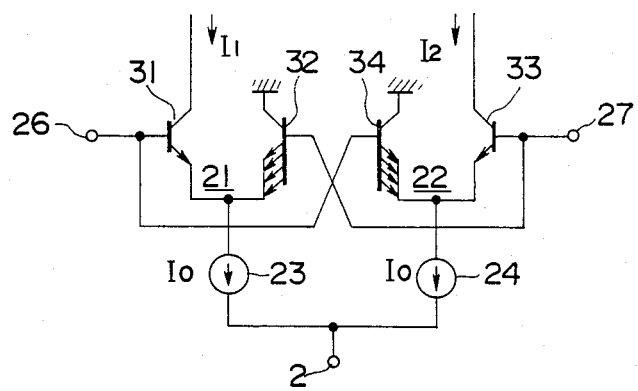
FIG. 3 is a circuit-wiring diagram of a portion of the circuit of FIG. 2.
Figure 5:
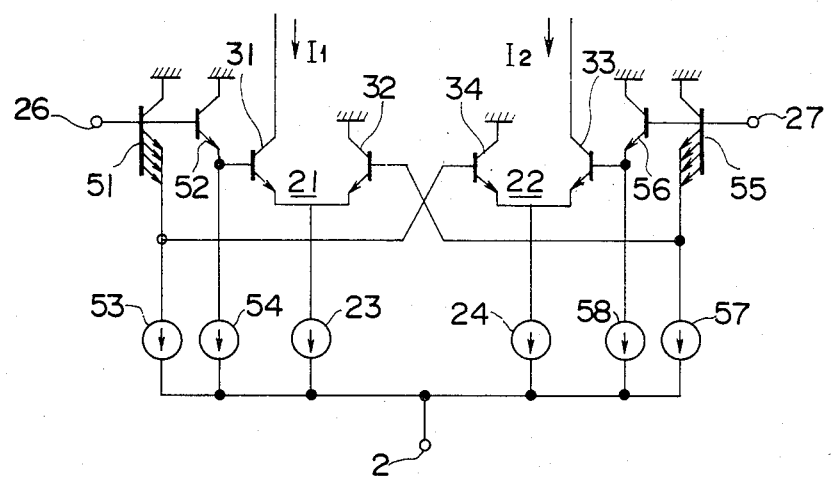
FIG. 5 is a circuit-wiring diagram of an essential portion of a variable gain circuit according to another embodiment of the present invention.

Referring now to FIG. 5, a portion of a variable gain circuit according to another embodiment of this invention will now be described, in which elements corresponding to those previously described in regard to the variable gain circuit of FIGS. 2 and 3 are identified by the same reference numerals and a detailed description thereof will be omitted herein for the sake of brevity. As shown therein, differential amplifiers 21 and 22 and constant current sources 23 and 24 are formed in the same manner as previously described in regard to the embodiment of FIG. 2, with the exception that the emitter areas of transistors 32 and 34 are not equal to N times the emitter areas of transistors 31 and 33, respectively. In addition to the arrangement shown in FIG. 2, the variable gain circuit of FIG. 5 supplies predetermined offset voltages across the base electrodes of transistors 31–34 to reduce the steady state currents supplied to current divider circuits 12 and 13, while maintaining larger values for maximum input current $i_{in}$ and maximum output current $i_{out}$. In particular, first input terminal 26 supplies the output from operational amplifier 8 to the base electrodes of two NPN bipolar junction transistors 51 and 52, each having their collectors connected to ground and their emitters connected to negative voltage supply terminal 2 through constant current sources 53 and 54, respectively. In like manner, second input terminal 27 supplies the bias voltage from bias voltage source 10 to the base electrodes of two NPN bipolar junction transistors 55 and 56 which have their collectors connected to ground and their emitters connected to negative voltage supply terminal 2 through constant current sources 57 and 58, respectively. The emitter of transistor 52 supplies an input signal to the base of transistor 31, while the emitter of transistor 56 supplies an input signal to the base of transistor 33. In like manner, the emitter of transistor 51 supplies an input signal to the base of transistor 34, while the emitter of transistor 55 supplies an input signal to the base of transistor 32.

In accordance with the embodiment shown in FIG. 5, the emitter areas of transistors 51 and 55 are N times larger than the emitter areas of transistors 52 and 56, respectively. In this manner, the saturation currents of transistors 51 and 55 are N times the saturation currents of transistors 52 and 56, respectively. If constant current sources 53, 54, 57 and 58 supply substantially equal and constant currents to the respective transistors, the effect of the arrangement of FIG. 5 is substantially identical to that of FIGS. 2 and 3 by providing predetermined offset voltages across the base electrodes of transistors 31–34, whereby to reduce the collector currents $I_1$ and $I_2$ of transistors 31 and 33 flowing to current divider circuits 12 and 13, resepectively. It is to be appreciated that an extremely large value of N can be selected by combining the embodiments of FIGS. 2 and 5, that is, by selecting the emitter areas of transistors 32 and 34 to be N times the emitter areas of transistors 31 and 33 in the embodiment of FIG. 5. As an alternative embodiment, the emitter areas of transistors 51 and 52 and transistors 55 and 56 can be made equal, while varying the ratio between the values of the constant currents supplied by constant current sources 53 and 54 and the values of the constant currents supplied by constant current sources 57 and 58, respectively, to provide the same result.

Figure 6:
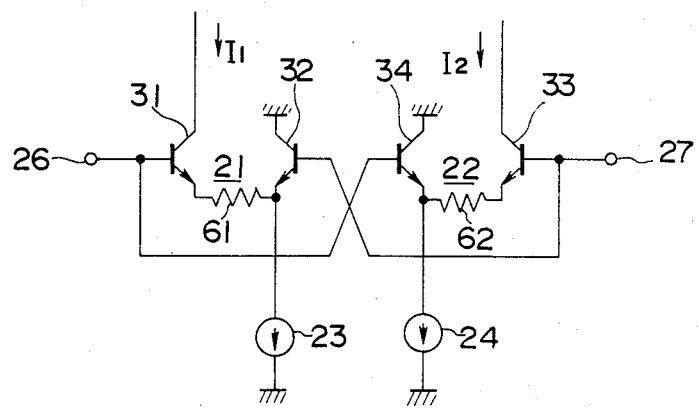
FIG. 6 is a circuit-wiring diagram of an essential portion of a variable gain circuit according to another embodiment of the present invention.

Referring now to FIG. 6, a portion of a variable gain circuit according to another embodiment of this invention is shown, in which elements corresponding to those described in regard to the variable gain circuit of FIGS. 2 and 3 are identified by the same reference numerals, and a detailed description thereof being omitted herein for the sake of brevity. In particular, the emitter areas of transistors 31 and 32 and transistors 33 and 34 of differential amplifiers 21 and 22, respectively, are substantially equal. However, a resistor 61 is connected between the emitter electrodes of transistors 31 and 32, with the constant current from constant current source 23 being supplied directly to the emitter of transistor 32 and through transistor 61 to the emitter of transistor 31. In like manner, a resistor 62 is connected between the emitters of transistors 33 and 34, such that the constant current from constant current source 24 is supplied directly to the emitter of transistor 34 and through resistor 62 to the emitter of transistor 33. The remaining elements and connections of the embodiment of FIG. 6 are identical to those shown in FIG. 2. By providing resistors 61 and 62 between the emitters of transistors 31 and 32 and transistors 33 and 34, respectively, the steady state or quiescent currents through current divider circuits 12 and 13 are substantially reduced in much the same manner as with the variable gain circuits of FIGS. 2, 3 and 5 according to the present invention.

Having described specific preferred embodiments of the invention with reference to the accompanying drawings, it is to be understood that the present invention is not limited to those precise embodiments, and that various changes and modifications may be effected therein by one skilled in the art without departing from the scope or spirit of the invention as defined in the appended claims.

What is claimed is:

1. A variable gain circuit comprising:
   first current divider means including first and second transistors of a first conductivity type producing at least one output signal in response to a control signal;
   second current divider means including third and fourth transistors of said first conductivity type producing at least one output signal in response to said control signal;
   amplifier means for producing a first signal in response to an input signal and the at least one output signal from said first and second current divider means;

first current source means for producing a first constant current;

second current source means for producing a second constant current;

first differential amplifier means for controlling current flow to said first current divider means in response to said first signal and said first constant current so that steady state currents flowing through said first current divider means are controlled to a value less than one-half of the value of said first and second constant currents;

second differential amplifier means for controlling current flow to said second current divider means in response to said second signal and said second constant current so that steady state currents flowing through said second current divider means are controlled to a value less than one-half of the value of said first and second constant currents;

current mirror means receiving said output signals from said first and second current divider means; and output means for producing an output signal in response to the at least one output signal from said first and second current divider means.

2. A variable gain circuit according to claim 1; in which said first and second transistors have commonly-connected first terminals and said third and fourth transistors have commonly-connected first terminals; and said first differential amplifier means comprises fifth and sixth transistors having first terminals supplied with said first constant current, and said second differential amplifier means comprises seventh and eighth transistors having first terminals supplied with said second constant current, said fifth transistor further including an output terminal for supplying current to said commonly-connected first terminals of said first and second transistors of said first current divider means and said seventh transistor further including an output terminal for supplying current to said commonly connected first terminals of said third and fourth transistors of said second current divider means.

3. A variable gain circuit according to claim 2; in which all of said fifth through eighth transistors are bipolar junction transistors, each having a base, an emitter and a collector, and said sixth and eighth transistors having emitter areas which are N times larger than emitter areas of said fifth and seventh transistors, respectively, where N is greater than one.

4. A variable gain circuit according to claim 2; in which said fifth and eighth transistors have respective input terminals supplied with the first signal from said amplifier means and said sixth and seventh transistors have respective input terminals supplied with a bias signal.

5. A variable gain circuit according to claim 2; in which said fifth through eighth transistors have respective input terminals; and further comprising means for supplying an offset signal to the input terminals of said fifth and seventh transistors in response to said first signal and a bias signal so that said steady state currents flowing through both said first and second current divider means are controlled to a value less than one-half of the value of said first and second constant currents.

6. A variable gain circuit according to claim 5; in which said means for supplying also supplies an offset signal to the input terminals of said sixth and eighth transistors in response to said first signal and said bias signal.

7. A variable gain circuit according to claim 5; in which said means for supplying includes ninth and tenth transistors having respective input terminals supplied with said first signal from said amplifier means and respective first terminals supplied with respective constant currents and which supply input signals to said input terminals of said fifth and eighth transistors, respectively; and eleventh and twelfth transistors having respective input terminals supplied with said bias signal and respective first terminals supplied with respective constant currents and which supply input signals to said input terminals of said sixth and seventh transistors, respectively.

8. A variable gain circuit according to claim 7; in which all of said ninth through twelfth transistors are bipolar junction transistors, each having a base, an emitter and a collector, and said tenth and twelfth transistors have emitter areas which are N times larger than emitter areas of said ninth and eleventh transistors, respectively, where N is greater than one.

9. A variable gain circuit according to claim 2; further including first resistive means connecting said first terminals of said fifth and sixth transistors such that said first constant current is supplied directly to said sixth transistor and through said first resistive means to said fifth transistor, and second resistive means connecting said first terminals of said seventh and eighth transistors such that said second constant current is supplied directly to said eighth transistor and through said second resistive menas to said seventh transistor.

10. A variable gain circuit according to claim 2; in which said first current source means includes means for supplying said first constant current to said first terminals of said fifth and sixth transistors and means for supplying said second constant current to said first terminals of said seventh and eighth transistors.

11. A variable gain circuit according to claim 1; in which said first through fourth transistors each include an output terminal for producing first through fourth output signals, respectively, and said output means produces said output signal in response to the second and third output signals.

12. A variable gain circuit according to claim 11; in which said amplifier means includes an operational amplifier for producing said first signal in response to said input signal and said first and fourth output signals.

* * * * *